United States Patent [19]
Johnson

[11] Patent Number: 5,266,905
[45] Date of Patent: Nov. 30, 1993

[54] AUDIO AMPLIFIER WITH AMPLIFIED FEEDBACK

[75] Inventor: William Z. Johnson, Edina, Minn.

[73] Assignee: Audio Research Corporation, Minneapolis, Minn.

[21] Appl. No.: 891,391

[22] Filed: May 29, 1992

[51] Int. Cl.[5] ............................................. H03F 1/34
[52] U.S. Cl. ....................................... 330/85; 381/121
[58] Field of Search ................. 330/85, 149, 258, 260, 330/293; 381/120, 121

[56] References Cited

U.S. PATENT DOCUMENTS

| | | | |
|---|---|---|---|
| 3,898,640 | 8/1975 | Hossbach | 340/258 R |
| 3,909,737 | 8/1975 | Dolby | 330/85 X |
| 3,917,993 | 11/1975 | Picmaus et al. | 323/75 B |
| 3,955,149 | 5/1976 | Trilling | 330/85 X |
| 4,190,806 | 2/1980 | Wermuth | 330/51 |
| 4,223,273 | 9/1980 | Yokoyama | 330/85 |
| 4,236,118 | 11/1980 | Turner | 330/149 X |
| 4,260,954 | 4/1981 | Crooks | 330/85 |
| 4,331,927 | 5/1982 | Scholz | 330/51 |
| 4,359,609 | 11/1982 | Apfel | 179/16 F |
| 4,510,458 | 4/1985 | Sato et al. | 330/260 |
| 4,549,146 | 10/1985 | Cowans et al. | 330/149 |
| 4,562,406 | 12/1985 | Baker | 330/85 |
| 4,819,249 | 4/1989 | Aiello et al. | 372/107 |
| 4,944,010 | 7/1990 | Ishiguro et al. | 381/4 |

OTHER PUBLICATIONS

Soliman, Ahmed M., "A New Phase Compensated Three Port VCVS with Controlled Gain Difference", L'orde Electrique, vol. 61, No. 12, Dec. 1981 pp. 39-41.
Natarajan, S. and Bhattacharyya, B. B., "Design and Some Applications of Extended Bandwidth Finite Gain Amplifiers", Proc. IEEE 1978 Symp. on Ckts. and Sys. pp. 700-701.

Primary Examiner—Steven Mottola
Attorney, Agent, or Firm—Merchant, Gould, Smith, Edell, Welter and Schmidt

[57] ABSTRACT

An audio amplifier with amplified feedback having a discrete component amplifier and an amplified negative feedback network. The amplified negative feedback network includes a feedback amplifier, a first resistor network, a second resistor network and a further feedback means for providing local negative feedback to the feedback amplifier and substantially removes a load associated with the output of the discrete component amplifier.

2 Claims, 1 Drawing Sheet

AUDIO AMPLIFIER WITH AMPLIFIED FEEDBACK

FIELD OF THE INVENTION

The present invention relates to audio amplifiers, and more particularly, to an audio amplifier circuit utilizing an amplified feedback network.

BACKGROUND AND SUMMARY OF THE INVENTION

In high performance audio amplifiers which utilize typical feedback networks, such as the prior art amplifier 10 shown in FIG. 1, the ratio of resistor 20 to resistor 18, or R1/R2, is such that severe loading problems may occur at the amplifier output 14. This is especially true when the audio circuitry utilized in conjunction with the audio amplifier is of high output impedance, as is the case of high voltage amplifiers utilizing discrete components. These loading problems can cause distortion and compression of the dynamic range for audio amplification.

According to the present invention, an audio amplifier circuit is shown which removes such loading problems from the amplifier output. The audio amplifier circuit comprises a discrete component amplifier having a non-inverting input, an inverting input and an output with an associated load thereof. An amplified negative feedback network substantially removes the load from the output of the discrete component amplifier. The amplified negative feedback network includes a feedback amplifier having a non-inverting input, an inverting input and an output, a first resistor network and a second resistor network and a further feedback network. The first resistor network includes a first resistor connected between the output of the discrete component amplifier and the non-inverting input of the feedback amplifier and a second resistor connected between the non-inverting input of the feedback amplifier and a signal common. The second resistor network includes a third resistor connected between the output of the feedback amplifier and the inverting input of the discrete component amplifier and a fourth resistor connected between the inverting input of the discrete component amplifier and signal common. The further feedback network provides local negative feedback for the feedback amplifier. The further feedback network comprises a fifth resistor connected between the inverting input of the feedback amplifier and signal common and a sixth resistor connected between the inverting input of the feedback amplifier and the output of the feedback amplifier.

A method for providing feedback for an audio amplifier composed of discrete components is also shown. The audio amplifier comprises a non-inverting input, an inverting input and an output with an associated load. An amplified feedback network is connected between the output of the audio amplifier and inverting input of the audio amplifier. The amplified feedback network includes a feedback amplifier having an inverting input, a non-inverting input, and an output. A first resistor and a second resistor are connected between the output of the audio amplifier and a signal common as a voltage divider such that the non-inverting input of the feedback amplifier is connected therebetween. A third resistor and a fourth resistor are connected between the output of the feedback amplifier and the signal common such that the inverting input of the audio amplifier is connected therebetween. A fifth resistor and sixth resistor are connected between the output of the feedback amplifier and signal common such that the inverting input of the feedback amplifier is connected therebetween. The first resistor and second resistor are selected to produce an impedance significantly greater than the output impedance of the audio amplifier such that the load associated with the output of the audio amplifier is substantially removed.

BRIEF DESCRIPTION OF THE DRAWINGS

In the drawings, in which like reference numerals indicate corresponding parts of the preferred embodiment of the present invention throughout several views.

DETAILED DESCRIPTION OF THE PREFERRED EMBODIMENT

Figure 2:
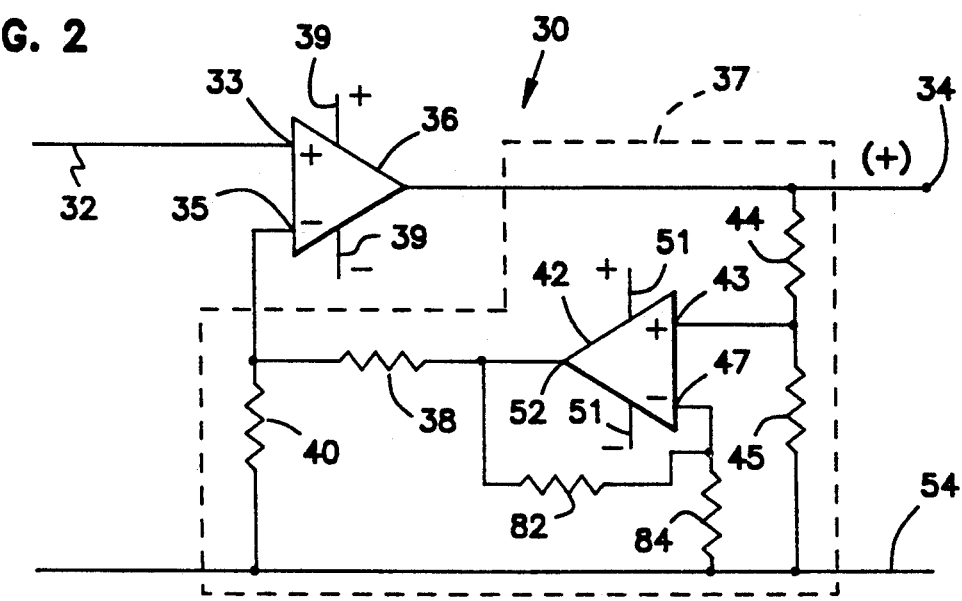
FIG. 2 is an electrical schematic of an audio amplifier with an amplified negative feedback network of the present invention.

The audio amplifier with the amplified negative feedback network of the present invention will be described with reference to FIGS. 2 and 3. FIG. 2 is a schematic illustration of the present invention which includes a high voltage amplifier 36 and amplified negative feedback network 37. The non-inverting input 32 of amplifier 36, may be operatively connected to audio equipment, such as a compact disk player, phonorecord player or cassette player. The output 34 of the audio amplifier 36 is connected to other audio equipment, for example, a power amplifier. The audio amplifier 36 is constructed primarily of discrete components. Although integrated circuit audio amplifiers are readily available, high voltage amplifiers constructed of discrete components provide additional high performance characteristics for audio amplification. Power is supplied to amplifier 36 by a power supply (not shown) via connections 39. The amplifier 36 has an output impedance associated with the output 34 of about 500 ohms. Feedback for the audio amplifier 36 is provided by the amplified negative feedback network 37 which is connected between the output 34 of audio amplifier 36 and the inverting input 35 audio amplifier 36.

Figure 1:
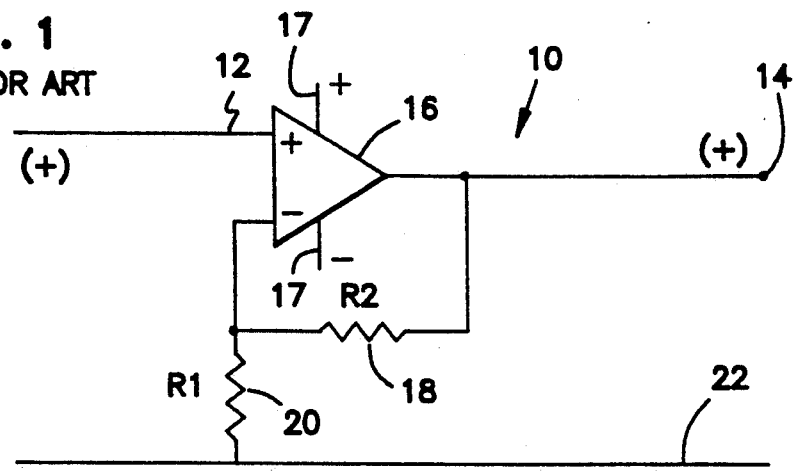
FIG. 1 is an electrical schematic of a prior art amplifier with passive feedback.

The amplified negative feedback network 37 includes feedback amplifier 42 which is supplied with power via power supply connections 51. The feedback amplifier 42 is preferably a combination of MOSFETS and an IC amplifier, however, other amplifiers can be utilized. The amplified negative feedback network 37, significantly reduces the load at output 34 associated with the high output impedance of audio amplifier 36. A first resistor network, including resistors 44 and 45 divide the output 34 for input to non-inverting input 43 of feedback amplifier 42. Resistor 44 and resistor 45 are in combination, preferably within the range of about 200K ohms. resistor 44 is connected between the output 34 amplifier 36 and non-inverting input of feedback amplifier 42. Resistor 45 is connected between the non-inverting input of feedback amplifier 42 and signal common 54. With the addition of this large 200K ohms load, the load associated with the 500 ohm output impedance of the audio amplifier is effectively removed and the signal provided at the output is significantly purer than when typical passive feedback is utilized as illustrated in FIG. 1. This is accomplished by selecting a high impedance resistance network of resistor 44 and 45 significantly greater than the amplifier output impedance of the audio amplifier 36.

Output 52 of feedback amplifier 42 is operatively connected to the inverting input 35 of audio amplifier 36 by means of a second resistor network, including resistor 38 and resistor 40. Resistor 38 is connected between the output 52 of feedback amplifier 42 and the inverting input 35 of audio amplifier 36. Resistor 40 is connected between signal common 54 and the inverting input 35 of audio amplifier 36. Preferably, resistor 38 is approximately 1,000 ohms and resistor 40 is approximately 200 ohms. For high performance characteristics, resistor 40 is less than 1,000 ohms. Utilizing feedback amplifier 42 and the first resistor network, including resistor 44 and resistor 45, resistor 40 can be said to be buffered from the output of the amplifier circuit. Resistor 38 also serves to reduce the noise contribution from feedback amplifier 42.

The amplifier circuit of FIG. 2 further includes a local feedback network for providing feedback for feedback amplifier 42. The local feedback network includes resistors 82 and 84. Typical values for each of these resistors is 10K ohms. This further local feedback network 80 allows the user additional control of amplifier 42. Resistor 82 is connected between the output 52 of feedback amplifier 42 and the inverting input 47 of feedback amplifier 42 and resistor 84 is connected between the inverting input 47 of feedback amplifier 42 and signal common 54.

Figure 3:
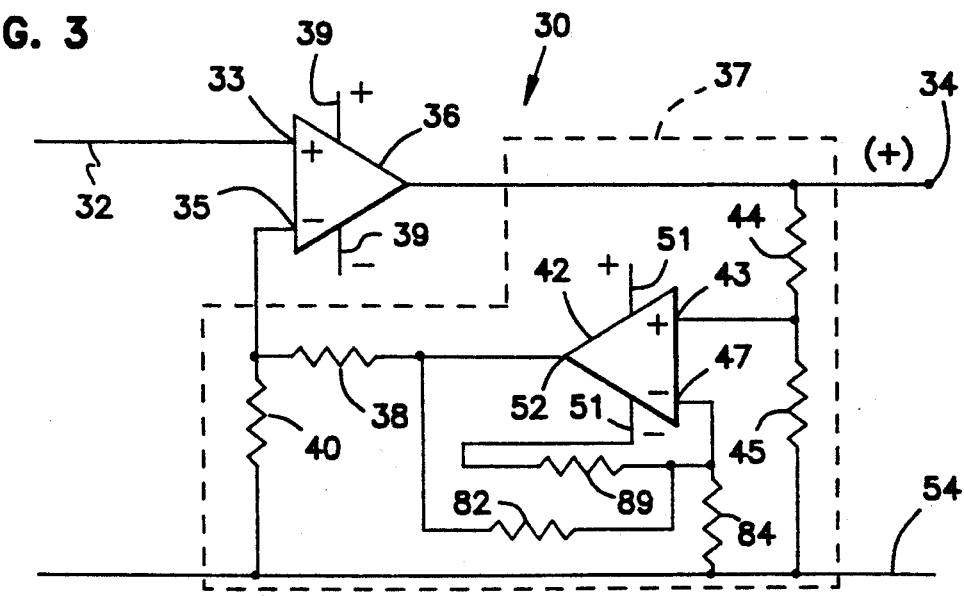
FIG. 3 is an electrical schematic of the audio amplifier as shown in FIG. 2 with a further offset correction resistor.

The local feedback network allows for the addition of offset correction resistor 89 as shown in FIG. 3. Associated with resistor 40 is a DC potential from current through audio amplifier 36. With typical passive feedback as shown in FIG. 1, this DC potential is passed along to the output 34 of audio amplifier 36 producing an offset voltage which causes adverse effects. The use of the local feedback network, including resistors 82 and 84 permits the insertion of an offset correction resistor 89 between the inverting input 47 of feedback amplifier 42 and the minus side of power supply (not shown) to feedback amplifier 42. Selection of the offset correction resistor 89 is such that the offset voltage across resistor 38 is corrected.

Although the present invention has been described herein in its preferred embodiment, those skilled in the art will recognize various modifications could be made thereto without departing from the spirit and scope of the invention as set forth in the claims amended hereto.

What is claimed is:

1. An audio amplifier circuit, comprising:
a discrete component amplifier having a non-inverting input, an inverting input and an output with an associated load;
negative feedback means for substantially removing the load from the output of the discrete component amplifier, the negative feedback means comprising:
a feedback amplifier including a non-inverting input, an inverting input and an output,
a first resistor network including a first resistor connected between the output of the discrete component amplifier and the non-inverting input of the feedback amplifier and a second resistor connected between the non-inverting input of the feedback amplifier and a signal common,
a second resistor network including a third resistor connected between the output of the feedback amplifier and the inverting input of the discrete component amplifier and a fourth resistor connected between the inverting input of the discrete component amplifier and the signal common, and
a further feedback means for providing local negative feedback for the feedback amplifier, the further feedback means comprising a fifth resistor connected between the inverting input of the feedback amplifier and signal common and a sixth resistor connected between the inverting input of the feedback amplifier and output of the feedback amplifier; and
an offset correction resistor connected between a power supply and the inverting input of the feedback amplifier.

2. A method for providing feedback for an audio amplifier composed of discrete components, the audio amplifier having a non-inverting input, an inverting input and an output with an associated load, the method comprising the steps of:
connecting an amplified feedback network between the output of the audio amplifier and the inverting input of the audio amplifier, the connecting step comprising the steps of:
providing a feedback amplifier having an inverting input, a non-inverting input, and an output,
connecting a first resistor and a second resistor between the output of the audio amplifier and a signal common as a voltage divider such that the non-inverting input of the feedback amplifier is connected therebetween,
connecting a third resistor and a fourth resistor between the output of the feedback amplifier and the signal common such that the inverting input of the audio amplifier is connected therebetween, and
connecting a fifth resistor and sixth resistor between the output of the feedback amplifier and signal common such that the inverting input of the feedback amplifier is connected therebetween; and
selecting the first resistor and second resistor to produce an impedance significantly greater than the output impedance of the audio amplifier such that the load associated with the output of the audio amplifier is substantially removed; and
connecting an offset correction resistor between a power supply and the inverting input of the feedback amplifier.

* * * * *